(12) United States Patent
Niggemann et al.

(10) Patent No.: US 10,581,002 B2
(45) Date of Patent: Mar. 3, 2020

(54) FLEXIBLE, THIN-FILM ELECTRONIC DEVICE

(71) Applicant: EIGHT19 LTD, Cambridge (GB)

(72) Inventors: Michael Niggemann, Cologne (DE); Jurjen Frederik Winkel, Ely (GB)

(73) Assignee: Eight19 Limited, Cambridge (GB)

( * ) Notice: Subject to any disclaimer, the term of this patent is extended or adjusted under 35 U.S.C. 154(b) by 127 days.

(21) Appl. No.: 15/534,017

(22) PCT Filed: Dec. 8, 2015

(86) PCT No.: PCT/GB2015/053751
§ 371 (c)(1),
(2) Date: Jun. 8, 2017

(87) PCT Pub. No.: WO2016/092287
PCT Pub. Date: Jun. 16, 2016

(65) Prior Publication Data
US 2018/0337353 A1    Nov. 22, 2018

(30) Foreign Application Priority Data

Dec. 10, 2014  (GB) .................................... 1421979.4
Aug. 18, 2015  (GB) .................................... 1514654.1

(51) Int. Cl.
*H01L 51/00* (2006.01)
*H01L 51/52* (2006.01)
(Continued)

(52) U.S. Cl.
CPC ........ *H01L 51/0097* (2013.01); *H01L 27/302* (2013.01); *H01L 51/442* (2013.01);
(Continued)

(58) Field of Classification Search
CPC . H01L 51/0097; H01L 27/302; H01L 51/442; H01L 51/448; H01L 51/5203;
(Continued)

(56) References Cited

U.S. PATENT DOCUMENTS 5,202,271 A * 4/1993 Kouzuma ......... H01L 31/03921
                                                          136/244
5,385,848 A    1/1995 Grimmer
(Continued)

FOREIGN PATENT DOCUMENTS

EP              2315252        4/2011
WO          20120114906        8/2012

OTHER PUBLICATIONS

Combined Search and Examination Report issued on GB 14 21979.4.
(Continued)

*Primary Examiner* — Peter Bradford
(74) *Attorney, Agent, or Firm* — Hartman Global IP Law; Gary M. Hartman; Domenica N. S. Hartman

(57) ABSTRACT

A flexible, thin film electronic device comprising a module cut from a web provided with one or more cells along substantially the whole of its length wherein the cells comprise a first electrode layer, a second electrode layer and one or more active layers provided between the electrode layers characterised in that the module includes one or more edge portions wherein an edge of the first electrode layer and an edge of the second electrode layer are each substantially coincident with an edge of the web.

11 Claims, 10 Drawing Sheets

(51) Int. Cl.
*H01L 27/30* (2006.01)
*H01L 51/44* (2006.01)

(52) U.S. Cl.
CPC ........ *H01L 51/448* (2013.01); *H01L 51/5203* (2013.01); *H01L 51/5253* (2013.01); *H01L 51/5278* (2013.01); *H01L 2251/5338* (2013.01); *H01L 2251/5392* (2013.01); *H01L 2251/566* (2013.01)

(58) Field of Classification Search
CPC ............. H01L 51/5253; H01L 51/5278; H01L 2251/5338; H01L 2251/5392; H01L 2251/566
See application file for complete search history.

(56) References Cited

U.S. PATENT DOCUMENTS

| | | |
|---|---|---|
| 5,637,537 A | 6/1997 | Nath et al. |
| 5,994,641 A | 11/1999 | Kardauskas |
| 2004/0187999 A1 | 9/2004 | Wilkinson et al. |
| 2006/0278965 A1 | 12/2006 | Foust et al. |
| 2011/0095277 A1* | 4/2011 | Beierlein ............ H01L 51/5203 257/40 |
| 2012/0146485 A1 | 6/2012 | Matsubayashi et al. |
| 2014/0000684 A1* | 1/2014 | Blochwitz-Nimoth ...................... B82Y 10/00 136/251 |
| 2015/0076106 A1* | 3/2015 | Pellerite ................... H01B 1/22 216/13 |
| 2016/0088756 A1* | 3/2016 | Ramadas ............ H01L 51/5253 361/728 |

OTHER PUBLICATIONS

Second Examination Report issued on GB 14 21979.4.
Combined Search and Examination Report issued on GB 15 14654.1.
Second Examination Report issued on GB 15 14654.1.
International Search Report and Written Opinion; PCT/GB15/053751; dated Feb. 8, 2016.

* cited by examiner

FLEXIBLE, THIN-FILM ELECTRONIC DEVICE

FIELD OF THE INVENTION

The present invention is concerned with a flexible, thin film electronic device of the type which may be formed by cutting a module from a roll provided with one or more electrical cells—as well as a method for its manufacture.

It is particularly, but not exclusively, concerned with a thin film electronic device in which the module provides for a large area solar cell or for a large area lighting tile.

BACKGROUND TO THE INVENTION

The manufacture of flexible, thin film solar modules is often carried out by a roll-to-sheet process in which a plurality of photovoltaic cells are provided along the length of a roll of a web (viz. in the web direction) so that they are spatially separated from one another and the web so provided is cut into a plurality of sheets (or modules) each containing one of the photovoltaic cells.

In this process, the plurality of separate photovoltaic cells are formed by providing a plurality of separate bottom electrodes in discrete areas on the web along the web direction.

The bottom electrodes may be deposited using, for example, printing techniques such as screen printing, ink-jet printing, gravure printing or intermittent printing or by vacuum deposition using a mask.

Preferably, however, the plurality of separate bottom electrodes is provided by vacuum deposition of a bottom electrode layer which is continuous along substantially the whole of the length of the web and patterning that layer by etching or by mechanical or laser scribing along the web direction.

The patterning may be followed by providing one or more active layers over each of the bottom electrodes and a top electrode over each of the one or more active layers. The top electrode may, however, be a top electrode layer which is continuous along substantially the whole of the length of the web.

Of course, the patterning may be carried out after providing one or more active layers over the bottom electrode layer and a top electrode layer over the one or more active layers each along substantially the whole of the length of the web.

In that case, the patterning may provide separate top electrodes along the length of the web instead of or as well as separate bottom electrodes along the length of the web.

In any case, the cutting of the sheets from the roll is in the gaps between separate bottom electrodes and/or top electrodes and the individual sheets are normally encapsulated to protect the device against the ingress of oxygen and/or water by laminating between a backing sheet and a cover sheet.

In one case, a continuous top electrode is provided along substantially the whole of the length of the web by thermal evaporation and a plurality of top electrodes formed along the web direction by laser scribing. The scribing provides for spatial and electrical separation of the top electrodes by removing electrode material in parallel lines across the direction of the web. The cutting of sheets from the roll is carried out in the area between the parallel lines and is followed by encapsulation.

Of course, the one or more active layers include a photoactive layer and each cell has at least one electrode which is substantially transparent. The one or more active layers between the photoactive layer and the transparent electrode layer are also substantially transparent.

The manufacture typically provides a solar module having a number of parallel photovoltaic cells. These photovoltaic cells are formed across the width of the web (viz. across the web direction) in a similar manner as the spatially separated photovoltaic cells so that all the photovoltaic cells across the web direction are connected in electrical series.

In one arrangement, the top electrode of each photovoltaic cell contacts the bottom electrode of an adjacent photovoltaic cell so as to provide for electrical conduction between the connected cells. Bus bars are also be provided on the web adjacent to the first and last of the connected cells prior to the cutting of the web or by fixing to a sheet before or after its encapsulation.

The above-described methods suffer from a number of disadvantages that make the manufacture of these devices somewhat inflexible and expensive.

One disadvantage is that the length of a module is defined on the roll by the gaps provided between separate bottom electrodes and/or top electrodes. After cutting and encapsulation, the length of a particular module cannot be changed and the installation of the module is restricted to its predetermined use.

A further disadvantage is that the printing of the top electrodes is complicated by the choice of an appropriate ink. The available inks typically provide layers which are either too thick and/or too costly. They are, in any case, often based on solvents which are difficult to fully remove—which can compromise device performance. Further, they do not typically offer any barrier to the ingress of oxygen and/or moisture to the device.

Another disadvantage is that the lamination of the individual sheets cut from the roll requires specialised and expensive sheet to sheet (or sheet to roll to sheet) lamination equipment.

Background information can be found in U.S. Pat. Nos. 5,637,537, 5,385,848, and 5,202,271.

SUMMARY OF THE INVENTION

The present invention generally seeks to overcome these disadvantages by providing an improved method of manufacture in which a module may be cut from the roll at a position on the web in which the cutting cuts both the top electrode and the bottom electrode.

The present invention also seeks to avoid the need for specialised equipment for encapsulating the individual sheets by providing roll to roll encapsulation.

Accordingly, in a first aspect, the present invention provides a flexible, thin film electronic device comprising a module cut from a web provided with one or more electrical cells along substantially the whole of its length wherein each cell comprises a first electrode layer, a second electrode layer and one or more active layers provided between the electrode layers and wherein the module includes one or more edge portions wherein an edge of the first electrode layer and an edge of the second electrode layer are each substantially coincident with an edge of the web.

Those skilled in the art will appreciate that such a web may be provided as a roll or as a length or as a module which has itself been cut from the roll or length.

It will also be appreciated that the length of the device can be chosen at the time of cutting. And that the shape of the device is not dictated by the shape of the web. The module may, in particular, be cut in any two-dimensional shape and portions can also be cut out of the module itself.

In one embodiment, the device may comprise a module having two or more said edge portions.

The device may, in particular, comprise a module which is rectilinear and has two said edge portions which are substantially opposite to each other.

Alternatively, the device may comprise a module which is circular. The circular module may have a single said edge portion or it may have two said edge portions which may or may not be substantially concentric with one another.

In some embodiments, the edge portions of the module extend inwardly from the edge to an extent between 1 µm and 2 cm, for example, between 5 µm and 1.5 cm, or between 10 µm and 1.0 cm or between 10 µm and 0.1 cm, and preferably between 10 µm and 500 µm.

The device may comprise a module in which at least one electrode layer is fragmented in said one or more edge portions whereby to prevent electrical shorting across a major portion of the device.

In embodiments, at least one of the edge portions of one or both of the electrode layers is a cut and fragmented edge portion comprising localised fragmentation extending along the whole of the cut and fragmented edge portion to prevent electrical shorting across a major portion of the device.

Alternatively or additionally, the device may comprise a module in which at least one layer of the module is delaminated from another layer of the module in said one or more edge portions whereby to prevent electrical shorting across a major portion of the device.

Preferably, the fragmentation extends along the whole or a major part of the cut edge of the module in said one or more edge portions. Similarly, the delamination preferably extends along the whole or a major part of the cut edge of the module.

In any case, the fragmentation and/or delamination preferably provides high resistance to electrical shunts in said one or more edge portions.

The device may comprise a module in which a first electrode layer and a second electrode are each fragmented in said one or more edge portions.

Whilst any of the layers of the module may be delaminated from an adjacent layer, it is preferred that the module does not include more than one electrode layer which is delaminated from an adjacent active layer in said one or more edge portions.

The presently described device is particularly suitable for extended use in vacuo or in an inert atmosphere. It is preferred, however, that it is encapsulated for extended use in air.

Accordingly, the device may comprise a module cut from a web which has been further provided with a cover sheet laminated to the web and wherein the web and the cover sheet each provide a barrier to the ingress of oxygen and water to the device.

Alternatively, the device may comprise a module cut from a web which has been further provided with a backing sheet and a cover sheet in which the electrode layers and the one or more active layers are sandwiched there between and wherein the backing sheet and the cover sheet each provide a barrier to the ingress of oxygen and/or water to the device.

In any case, it is preferred that the device comprises a module which is further provided with a sealing means after it is cut from the web for sealing the edge of said edge portions whereby to prevent the ingress of oxygen and/or water to the device. The sealing means may also inhibit further delamination of the module during its lifetime.

The sealing means may, for example, comprise a sealing compound, sheet or a tape which adheres along the edge and onto an upper and a lower surface of the module. It may additionally or alternatively comprise a resilient elongate member which extends along the edge of the module and has engaging members which sealingly engage with an upper and a lower surface of the module.

Of course, the device may also comprise a module including an adhesive layer provided between the cover sheet and the top electrode layer and/or an adhesive layer provided between the backing sheet and the web.

In a preferred embodiment, one or both of the adhesive layers are deformable and, in particular, is or are plastically deformed when the module is cut from the web.

It also preferred that the web is deformable and, in particular, is plastically deformed during the cutting.

In one embodiment, the one or more active layers include a photoactive layer or a light emitting layer. Of course, other active layers such hole-injecting layers, electron-injecting layers, hole-transport layers, electron-transport layers or recombination layers may also be present.

In this embodiment, the top electrode layer and/or the bottom electrode layer should be substantially transparent and the one or more active layers between a transparent electrode layer and the photoactive or light emitting layer should also be substantially transparent.

It is preferred, however, that the top electrode layer is opaque and that the bottom electrode layer is transparent.

The device may, in particular, comprise a solar module or a lighting module. It may be a large area solar module or a large area lighting module (more generally known as a lighting tile) which is cut from a length of a web comprising a single, large area photovoltaic, or light emitting, cell.

The material and thickness of each the various layers of the device will be chosen so as to permit the cutting of both the electrode layers and, in particular, the fragmentation of one or both of the electrode layers, or the delamination of one or more layers from an adjacent layer, in the edge portions of the module. The material and thickness may, however, be conventional to flexible, thin film electronic devices.

In a second aspect, the present invention provides a method for manufacturing a flexible, thin film electronic device, which method comprises providing one or more cells along substantially the whole of a length of a web wherein the cells comprise a first electrode layer, a second electrode layer and one or more active layers provided between the electrode layers characterised by cutting the web and the electrode layers to form a module which includes one or more edge portions wherein an edge of the first electrode layer and an edge of the second electrode layer are substantially coincident with an edge of the web.

Those skilled in the art will appreciate that cutting the module from such a web may comprise cutting from a roll of the web or cutting from a length of the web or cutting from a module which has itself been cut from the roll or length.

It will also be appreciated that the method permits a length for the device to be chosen at the time of cutting. And that it additionally permits a shape for the device which is not dictated by the shape of the web.

The cutting may provide a module in any two-dimensional shape and may include cutting portions out of the module itself.

The cutting may provide a module comprising two or more said edge portions.

In one embodiment, the cutting provides a module which is rectilinear and has two said edge portions which are substantially opposite to one another.

In another embodiment, the cutting provides a module which is circular. The cut circular module may have a single said edge portion or it may have two said edge portions which may or may not be substantially concentric with one another.

In any case, the cutting may provide a module in which at least one electrode layer is fragmented in said one or more edge portions whereby to prevent electrical shorting across a major portion of the device.

Alternatively or additionally, the cutting may provide a module in which at least one layer of the module is delaminated from another layer of the module in said one or more edge portions whereby to prevent electrical shorting across a major portion of the device.

Preferably, the fragmentation extends along the whole or a major part of the cut edge of the module in said one or more edge portions. Similarly, the delamination preferably extends along the whole or a major part of the cut edge of the module.

In one embodiment, the method provides a module in which a first electrode layer and a second electrode are each fragmented in said one or more edge portions.

The method may provide that any layer of the module is delaminated from an adjacent layer, but it is preferred that it does not provide more than one electrode layer which is delaminated from an adjacent active layer in said one or more edge portions.

In some embodiments, the cutting provides that the edge portions in which at least one electrode is fragmented and/or delaminated extends inwardly from the edge to an extent between 1 um and 2 cm, for example, between 5 μm and 1.5 cm, or between 10 μm and 1.0 cm or between 10 μm and 0.1 cm, and preferably between 10 μm and 500 μm.

In a preferred embodiment, the method further comprises providing a cover sheet by laminating the web before the cutting wherein the web and the cover sheet each provide a barrier to the ingress of oxygen and water to the device.

In another embodiment, the method further comprises providing a backing sheet and a cover sheet to the web before the cutting whereby to sandwich the electrode layers and the one or more active layers there between and wherein the backing sheet and the cover sheet each provide a barrier to the ingress of oxygen and water to the device.

In these embodiments, the cutting may provide a module including one or more edge portions wherein an edge of the first electrode layer and an edge of the second electrode layer are each substantially coincident with an edge of the web and an edge of the cover sheet.

Preferably, the method further comprises providing sealing means to the module for sealing the edges in said edge portions whereby to prevent the ingress of oxygen and/or water to the device.

The method may further comprise providing an adhesive layer between the top electrode and the cover sheet and/or an adhesive layer between the web and the backing sheet.

In particular, the method may provide that one or both of these adhesive layers are deformable and are plastically deformed by the cutting of the web. It may also provide that the web is deformable and is plastically deformed during the cutting.

The cutting may, in particular, be carried out by any suitable technique but it is preferred that the cutting technique results in fragmentation of at least one electrode layer, and/or the delamination of at least one layer from the other layers of the module, in said one or more edge portions.

A shear cutting is suitable for this purpose and can be achieved, for example, by a rotary blade cutter, by scissors or by a guillotine, by stamping or punching out, or by knife cutting. In particular, punching techniques cause fragmentation of at least one electrode layer, and/or the delamination of at least one layer from the other layers of the module, in the one or more edge portions.

In one embodiment, the cutting may comprise cutting the module from the web in a first direction and cutting a portion of the module in a second direction which is opposite from the first direction.

In shear cutting, the shape and form of the cutting blades may provide tensile stresses which are different in a part or side of the web which is supported between the cutting blades or a cutting blade and some other part of the cutting device as compared to a part or side of the web which is not supported by the cutting blades or a cutting blade and some other part of the cutting device.

The tensile stresses may produce a module in which fragmentation of the at least one electrode layer in a first edge portion is substantially greater than fragmentation of the at least one electrode layer in a second edge portion.

By cutting a portion of the module in a second direction which is opposite from the second direction, a more efficient module (having a higher electrical shunt resistance) may be obtained.

Of course, the cutting in the second direction may be carried out at the same time or following the cutting in the first direction.

The double cutting of the module and discard of a portion of the module may be avoided when the cutting is preceded or followed by sharp bending, or by localised heating or by sonication of the web whereby to introduce fragmentation and/or delamination of at least one layer in portions of the web which correspond to said one or more edge portions after the cutting.

In that case, it is not particularly important which cutting technique is adopted. Laser cutting may, for example, be used instead of a shear cutting technique.

In one embodiment, the one or more active layers includes a photoactive layer or a light emitting layer. Of course, they may also include other active layers such as a hole-injecting layer, an electron-injecting layer, a hole-transport layer, an electron-transport layer or a recombination layer.

In this embodiment, the method should provide that at least one of the electrode layers is substantially transparent and that the one or more active layers between a transparent electrode layer and the photoactive or light emitting layer is also substantially transparent.

The method may provide a device which comprises a solar module or light emitting module. It may, in particular, comprise providing only a plurality of large area photovoltaic or light emitting cells to the web so that the cutting forms a large area solar module or a large area light emitting module (more generally known as a lighting tile).

Of course, the cutting from the web need not take place immediately following the providing of the web or even on the same premises as those providing the web.

In a third aspect, therefore, the present invention provides a roll of web providing for one or more flexible, thin film electronic devices, which roll comprises a web provided with one or more cells along substantially the whole of its length wherein the cells comprise a first electrode layer, a second electrode layer and one or more active layers provided between the electrode layers and, optionally, a cover sheet covering the cells on the web whereby a module can be cut from the web so provided so that it includes one or more edge portions wherein an edge of the first electrode layer and an edge of the second electrode layer are substantially coincident with an edge of the web and an edge of the cover sheet.

The roll may be provided with a temporary or permanent sealing means whereby to prevent the ingress of oxygen and/or water to the web or the device.

The temporary sealing means may be, for example, packaging and, in particular, vacuum packaging.

In some embodiments the web so provided may include indents or other visible marks to indicate where to cut. The visible marks may be formed by sharp bending or by heating of the web in portions which correspond to the one or more edge portions of the module after the cutting.

Other embodiments of the third aspect of the invention will be apparent from those described for the first and/or second aspects of the invention.

In a fourth aspect, the present invention provides for a kit of parts, comprising a roll of web providing for one or more flexible, thin film electronic devices, which roll comprises a web provided with one or more cells along substantially the whole of its length wherein the cells comprise a first electrode layer, a second electrode layer and one or more active layers provided between the electrode layers and, optionally, a cover sheet covering the cells on the web; and a cutting tool for cutting a module from the web so provided so that it includes one or more edge portions wherein an edge of the first electrode layer and an edge of the second electrode layer are substantially coincident with an edge of the web and an edge of the cover sheet.

In a preferred embodiment, the cutting tool is a shear cutting tool which provides that both sides of the web are supported during the cutting whereby to ensure to ensure fragmentation or delamination of at least one electrode layer in portions of the web which correspond to said one or more edge portions in modules formed by the cutting.

In one embodiment, for example, when the web is not provided with a cover sheet, the roll may be provided with a temporary or permanent sealing means whereby to prevent the ingress of oxygen and/or water to the web or the device.

The temporary sealing means may be, for example, packaging and, in particular, vacuum packaging.

Other embodiments of the fourth aspect of the invention will be apparent from those described for the first and/or second aspects of the invention.

The present invention enables the manufacture of solar modules or lighting modules by a roll-to-sheet process including lamination on the roll which can be carried out by standard equipment.

It also enables a high degree of flexibility because the length and shape of the module are determined at the time of cutting. The choice of length and shape of a module enables the device to be tailored to a specific use or location or adapted to a specific use or location at the point of installation.

It also provides that faulty sections of the web can be easily removed and so provides a higher yield of modules as compared to prior art processes.

It further provides for fewer steps in the manufacture of the module as compared to conventional methods in that it removes the need for patterning of (at least) the electrode layers.

In a fifth aspect of the invention, there is provided a flexible, thin film electronic device comprising a module cut from a web provided with one or more electrical cells along substantially the whole of its length wherein each cell comprises a first electrode layer, a second electrode layer and one or more active layers provided between the electrode layers, wherein the module includes one or more edge portions wherein an edge of the first electrode layer and an edge of the second electrode layer are each substantially coincident with an edge of the web, and includes a sealing means for sealing said edges of said edge portions whereby to prevent the ingress of oxygen and/or water to the device.

Advantageously, encapsulation and sealing of the device may be performed directly after cutting the module from the web, because the one or more edge portions do not contain any electrical shorts between the electrode layers as explained below.

The sealing means of the device may also inhibit further delamination of the module during its lifetime.

In a sixth aspect of the invention, there is provided a method for manufacturing a flexible, thin film electronic device, which method comprises providing one or more cells along substantially the whole of a length of a web wherein the cells comprise a first electrode layer, a second electrode layer and one or more active layers provided between the electrode layers characterised by cutting the web and the electrode layers to form a module which includes one or more edge portions wherein an edge of the first electrode layer and an edge of the second electrode layer are substantially coincident with an edge of the web, and providing sealing means for sealing said edges of said edge portions whereby to prevent the ingress of oxygen and/or water to the device.

In a seventh aspect of the invention, there is provided a roll of web providing for one or more flexible, thin film electronic devices, which roll comprises a web provided with one or more cells along substantially the whole of its length wherein the cells comprise a first electrode layer, a second electrode layer and one or more active layers provided between the electrode layers and, optionally, a cover sheet covering the cells on the web whereby a module can be cut from the web so provided so that it includes one or more edge portions wherein an edge of the first electrode layer and an edge of the second electrode layer are substantially coincident with an edge of the web and an edge of the cover sheet, and wherein the module comprises a sealing means for sealing said edges of said edge portions to prevent the ingress of oxygen and/or water to the device.

In an eighth aspect of the invention, the present invention provides for a kit of parts, comprising a roll of web providing for one or more flexible, thin film electronic devices, which roll comprises a web provided with one or more cells along substantially the whole of its length wherein the cells comprise a first electrode layer, a second electrode layer and one or more active layers provided between the electrode layers and, optionally, a cover sheet covering the cells on the web; and a cutting tool for cutting a module from the web so provided so that it includes one or more edge portions wherein an edge of the first electrode layer and an edge of the second electrode layer are substantially coincident with an edge of the web and an edge of the cover sheet, and wherein the module comprises a sealing means for sealing said edges of said edge portions to prevent the ingress of oxygen and/or water to the device.

The above-described features and embodiments apply equally to the fifth, sixth, seventh and eighth aspects.

BRIEF DESCRIPTION OF THE DRAWINGS

The present invention will now be described in detail with reference to the following embodiments as illustrated in the accompanying drawings in which.

DETAILED DESCRIPTION OF THE DRAWINGS

Figure 1:
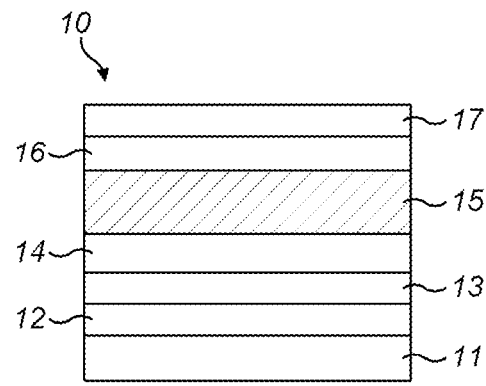
FIG. 1 is a section view of part of a solar module showing a typical photovoltaic cell therein.

Referring now to FIG. 1, a typical thin film photovoltaic device comprises a "stack" 10 of thin film layers which are built up on a transparent layer 11 of a substrate material.

The stack includes a transparent barrier layer 12, which is substantially impermeable to oxygen and/or water, provided on the substrate layer, a transparent bottom electrode layer 13 provided on the barrier layer, a transparent interface layer 14 (such as a hole-injecting or electron-injecting layer) provided on the bottom electrode layer, a layer of a photo-active material 15 provided on the interface layer, a further interface layer 16 provided on the layer of photoactive material and a top electrode layer 17 provided on the further interface layer.

The further interface layer 16 and the top electrode layer 17 may or may not be transparent.

The substrate material (for example, polyethylene terephthalate, PET) preferably extends beyond the other layers along the web direction so as to enable encapsulation of the stack by laminating with a cover sheet (not shown) which is also impermeable to oxygen and/or water. The cover sheet may or may not be transparent.

Figure 2:
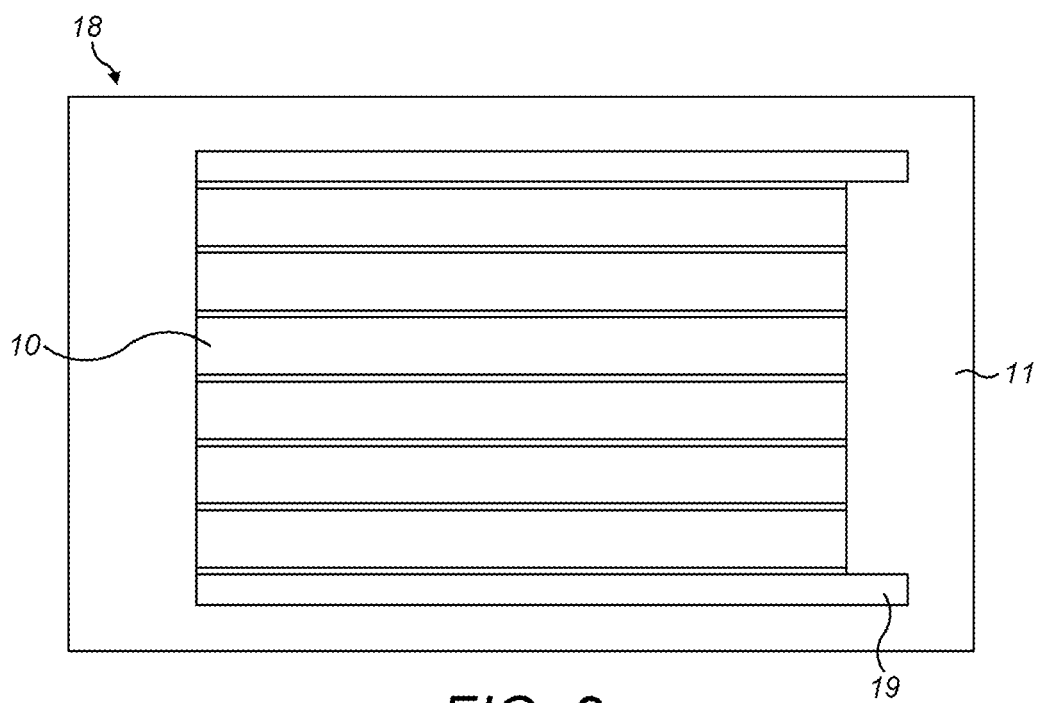
FIG. 2 is a plan view showing a prior art solar module in which a plurality of such photovoltaic cells are connected in electrical series across a width of the module.

FIG. 2 shows a solar module 18 in which six such stacks 10 are encapsulated within the substrate material and a transparent cover sheet. Each stack extends along a part of the length of the module and the stacks are connected in electrical series across a width of the module. Bus bars 19 are provided adjacent the first and last of the connected stacks and along a part of the length of the module. The bus bars are also encapsulated within the substrate material and the cover sheet.

Figure 3:
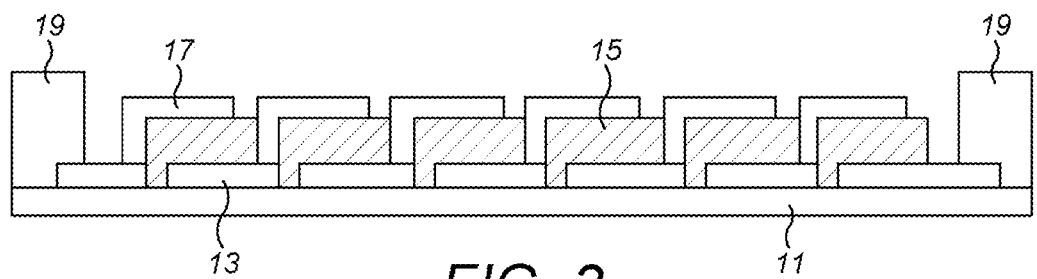
FIG. 3 is a section view showing the arrangement of electrodes connecting the photovoltaic cells in a solar module of FIG. 2.

FIG. 3 shows the arrangement of electrode layers in the module of FIG. 2 (barrier and interface layers not shown) which provides that the stacks 10 are connected in electrical series across a width of the module.

A top electrode layer 17 is made so that it is offset with and contacts a bottom electrode layer 13 so that it overlaps with a neighbouring bottom electrode layer. The overlapping electrode layers together enclose the one or more active layers so as to define a major portion comprising a stack and a minor portion comprising only the top electrode and the one or more active layers.

Figure 4:
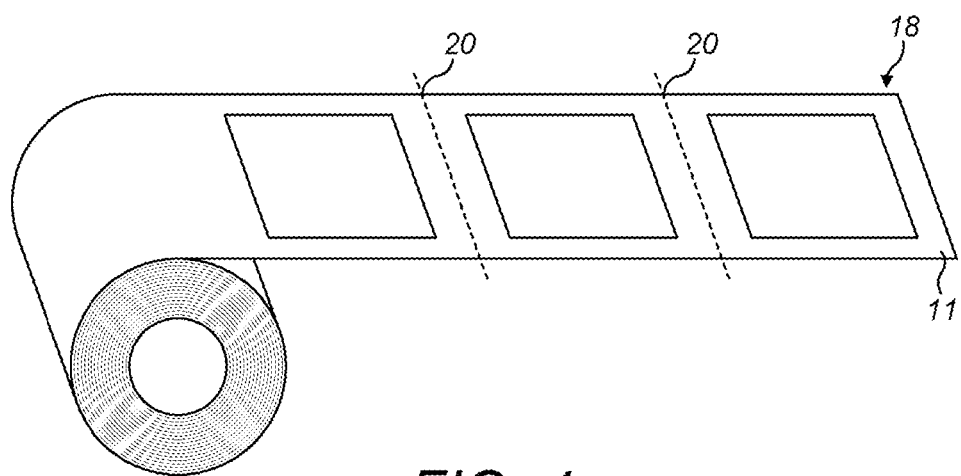
FIG. 4 is a schematic view illustrating the cutting of the modules of FIG. 2 from a roll of a web provided with photovoltaic cells.

FIG. 4 illustrates the cutting of the solar modules 18 of FIG. 2 from a roll provided with a plurality of separate stacks along the web direction and a plurality of connected stacks across the web direction.

The modules are cut from the roll in the gaps 20 between the separate stacks.

After the modules are cut, the stack is encapsulated by laminating the web with a cover sheet using sheet to sheet lamination equipment (not shown).

Figure 5:
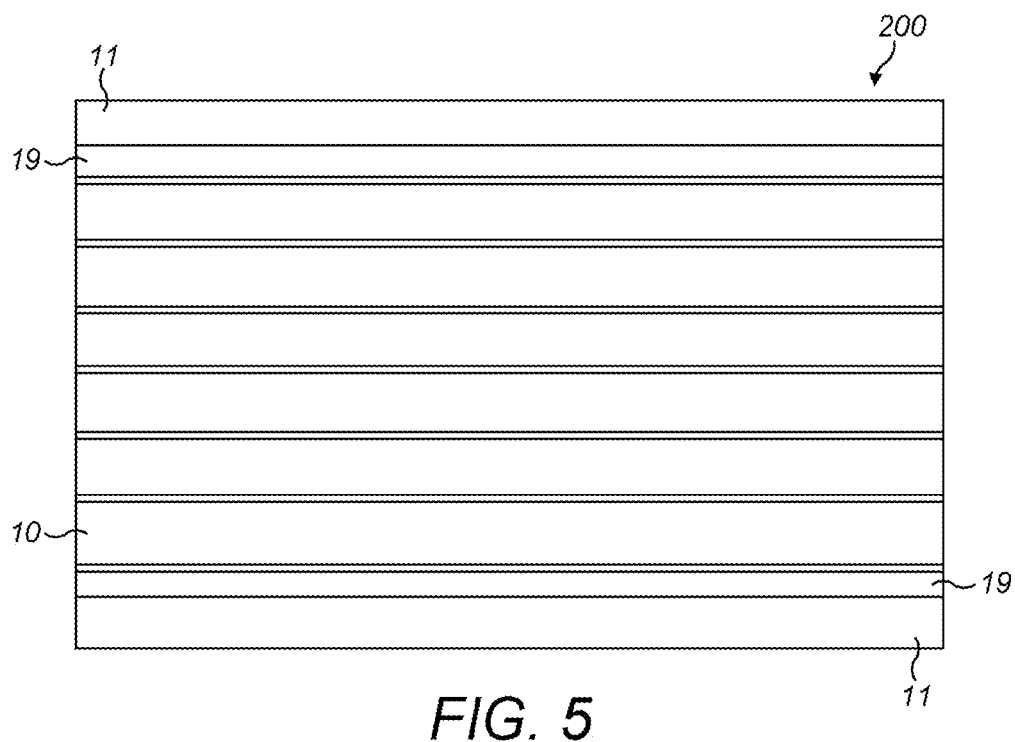
FIG. 5 shows plan views of a solar module obtained by cutting a roll according to one embodiment of the present invention.

FIG. 5 shows a rectangular solar module 200 according to one embodiment of the present invention. Each of the connected stacks 10 extend across substantially the whole of the length of the module 200. The module 200 is provided with a sealing means for sealing the edges (right and left hand side) of the module (not shown).

The cutting of the solar modules 200 of FIG. 5 is from a roll provided with a stack extending along substantially the whole of the length of the web and a plurality of connected such stacks extending across a major part of the width of the web.

The manufacture of such a roll is particularly advantageous because the various layers of the stack can be simply provided over the top of each other without the need for procedures aligning or etching along the web direction so as to provide for a plurality of spatially separated stacks.

The modules 200 are cut from the roll across the top electrode layer and the bottom electrode layer.

After the cutting, a lateral edge of each of the top electrode layer and of the bottom electrode layer of the module are coincident with a lateral edge of the web.

The roll can be provided with a cover sheet (not shown) before the cutting by lamination using, for example, a nip roller.

In that case, after the cutting, the lateral edges of each of the top electrode layer and the bottom electrode layer of the module are coincident with the lateral edge of both the web and the cover sheet.

Of course, the same is true for the roll which remains behind—but the subsequent cutting of another module from the remaining roll may cut the web in either a gap between separate stacks or across the top electrode layer and the bottom electrode layer.

Figure 6:
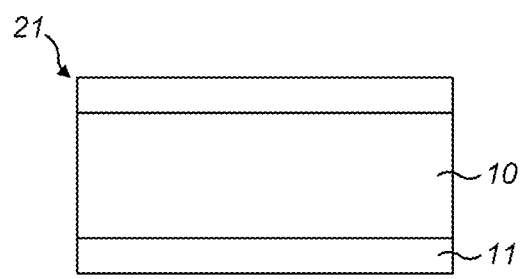
FIG. 6 shows a plan view of a solar module obtained by cutting a roll according to another embodiment of the present invention.

FIG. 6 shows a rectangular, large area solar module 21 according to another embodiment of the present invention. The module comprises a single stack 10 which extends along substantially the whole of the length and across a major part of the width of the module.

Without wishing to be bound by theory, it is thought that the cutting of the module involves localised fragmentation of one or both of the electrode layers and/or localised delamination of at least one layer from an adjacent layer, in the edge portions of the module.

Figure 7:
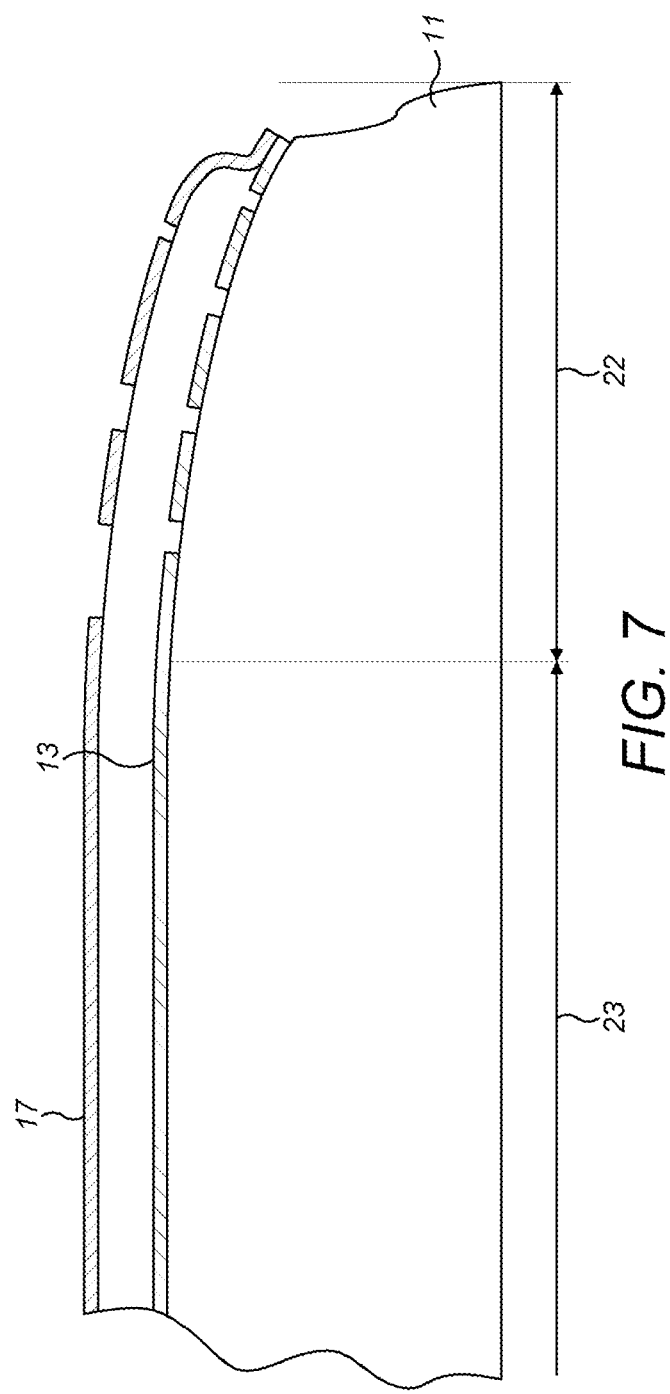
FIG. 7 is a sketch showing a part-section view illustrating fragmentation of the electrode layers in the edge portions of the module according to one embodiment of the present invention.

FIG. 7 shows the localised fragmentation of the bottom electrode layer 13 and the top electrode layer 17. As may be seen, the fragmentation is confined to the edge portion 22 and does not appear in the major portion 23 of the module.

Figure 8:
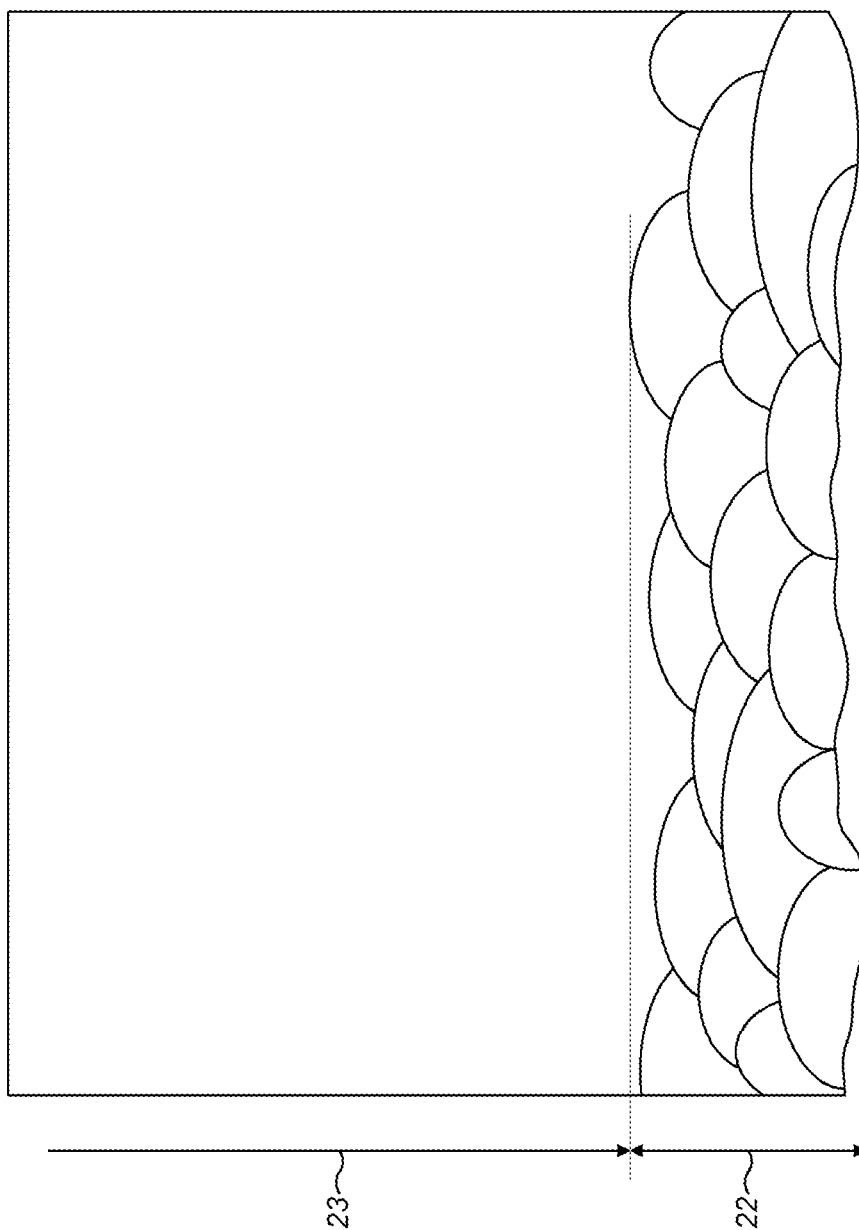
FIG. 8 is a sketch showing a top view illustrating fragmentation of an electrode layer in the edge portions of the module according to one embodiment of the present invention.

FIG. 8 shows another view of the fragmentation of the top electrode layer 17 in the edge portion. The fragmentation extends along the whole of a cut edge (shown as jagged) which is created by the cutting.

The fragmentation in the edge portion means that any contact between the electrode layers at the cut edge, which results from plastic deformation of the substrate 11 and/or adhesive layer, does not lead to electrical shorting of the solar module.

Figure 9:
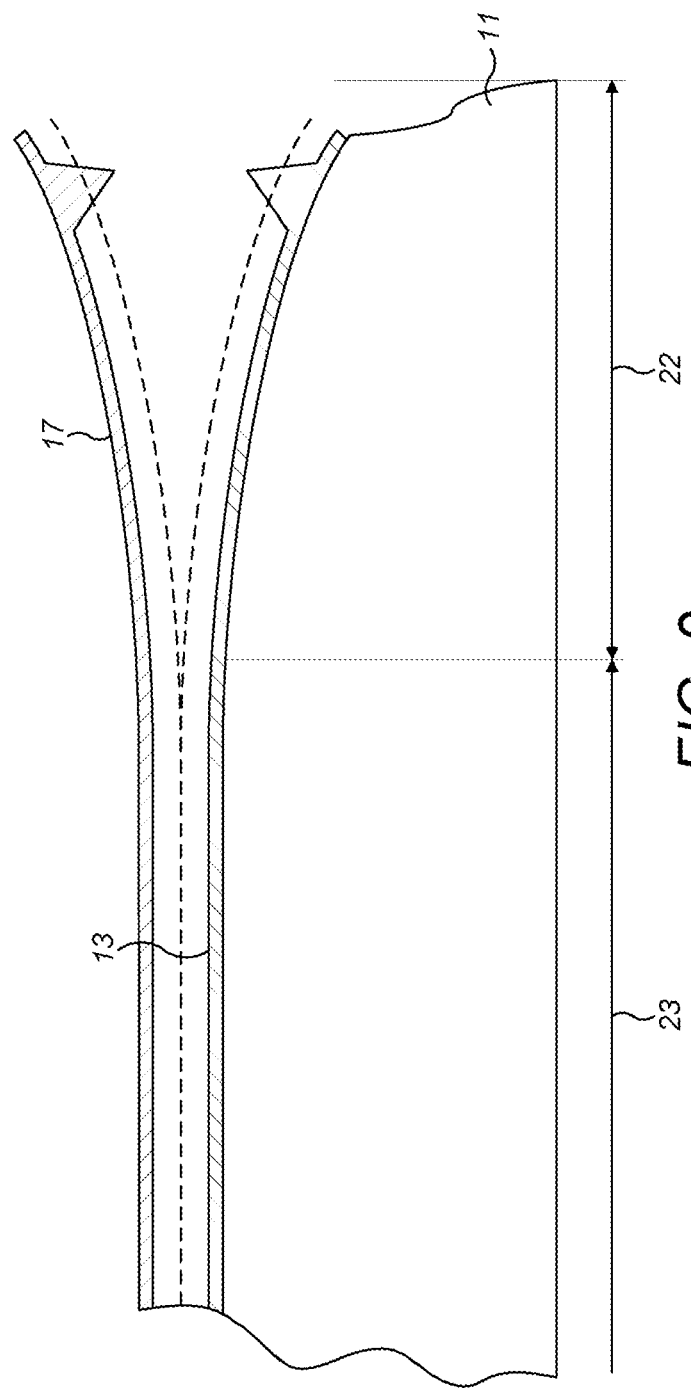
FIG. 9 is a sketch showing a part-section view illustrating delamination within the edge portions of the module according to one embodiment of the present invention.

FIG. 9 shows localised delamination of adjacent layers within the cut module. As may be seen, the delamination is confined to the edge portion 22 and does not appear in the major portion 23 of the module.

The delamination in the edge portion means that the cut edges of the bottom and top electrode layers 13 and 17 are separated to an extent that jagged edges (shown here as teeth) which result from the cutting and which may otherwise be in contact are put beyond contact with each other.

Figure 10:
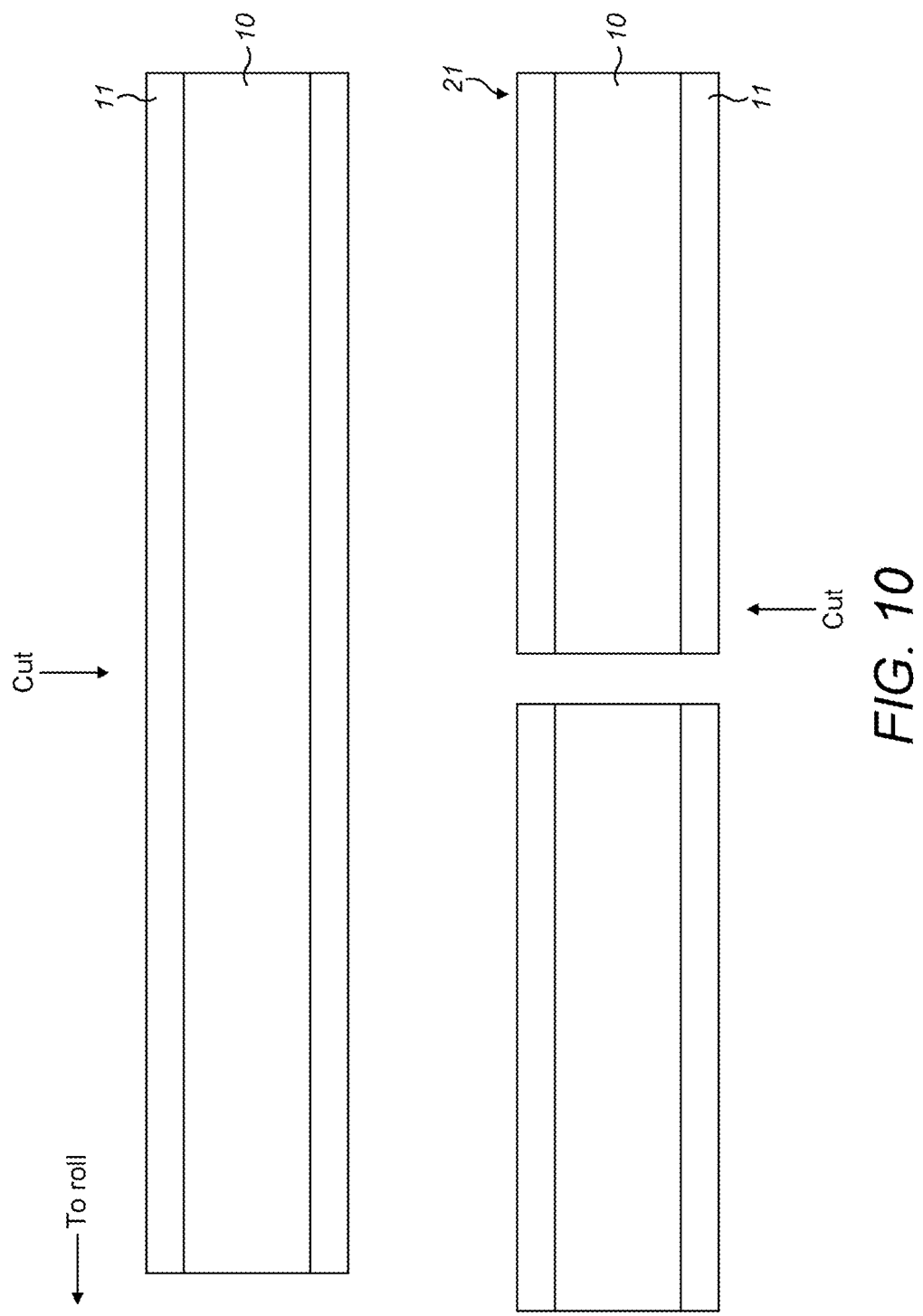
FIG. 10 is a scheme illustrating double cutting of a module from a roll of a web according to one embodiment of the present invention.

FIG. 10 shows a plan view of part of a roll of a web illustrating cutting steps which may be used with a rotary cutter to obtain an efficient solar module similar to that shown in FIG. 6.

The module 21 is first cut from the roll by cutting across the roll web using a rotary cutter in a first direction (A). Because the fragmentation of the electrode layers in the module 21 is less extensive than the fragmentation of the electrode layers in the roll, the separated module 21 is cut across the web using the rotary cutter in the opposite direction to the first direction so as to ensure fragmentation of at least one electrode layer in the edge portion of the module. Of course, the double cutting means that a small portion of the cut web and stack is discarded (B).

The effect of cutting can be seen in experiments in which solar modules similar to that shown in FIG. 2 are cut by a rotary blade cutter across the width of the module in a portion including electrode layers.

A first module comprises stacks having an inverted architecture which are formed on a transparent PET web provided with a transparent indium tin oxide layer (125 μm thick) by depositing a zinc oxide nanoparticle based electron transport layer (30 nm thick), followed by a P3HT:PCBM photoactive layer (300 nm thick) followed by a PEDOT:PSS interface layer (100 nm thick) and finally an evaporated silver, top electrode layer (100 nm).

A second module is similar to the first but includes a barrier sheet (UBF9L Ultra-barrier film available from 3M; about 100 μm thickness) covering the stacks. A contact tape is provided to the stacks before the barrier sheet is laminated over the stacks and onto the web using an elastic adhesive (about 100 μm thickness). The contact tape extends from the device so as that electrical measurements can be made on the module.

A third module is similar to the second but includes an additional, barrier sheet (UBF9L Ultra-barrier film, available from 3M, about 100 μm thickness) laminated to the substrate using the same elastic adhesive. A contact tape is provided to the stacks before the barrier sheets are laminated over the stacks and onto the web. The contact tape extends from the device so as that electrical measurements can be made on the module.

Table I shows the open circuit voltages ($V_{oc}$) under low light illumination (at 200 lux) of these modules and of the solar modules obtained by cutting these modules in half

TABLE I

| Module/Orientation | Pre-cut/$V_{oc}$ | Post-cutA/$V_{oc}$ | Post-cut B/$V_{oc}$ |
|---|---|---|---|
| First/Ag side up | 2.728 | 3.067 | 2.466 |
| Second/Ag side up | 2.943 | 2.877 | 0 |
| Second/Ag side down | 2.988 | 2.982 | 1.008 |
| Second/Ag side supported | 2.543 | 3.035 | 0 |
| Third/Ag side up | 2.565 | 3.043 | 0 |

The cutting of each module was carried out silver side up and silver side down. A voltage drop in one or other of the cut modules as compared to the uncut module indicates poor performance due to an electrical short (or "shunt").

As may be seen, the two, cut modules show a difference in performance as compared to each other. The difference corresponds with the shape and configuration of the cutting blade. A cut module which corresponds to the side of the module which is held or supported on the bed of the cutter (post-cut A) during the cutting shows better performance than the cut module which corresponds to the side of the module which is not held or supported on the bed of the cutter during the cutting (post-cut B).

The first, post-cut A-module shows higher voltage than the first module when the first module is cut silver side up whilst the first, post-cut B-module shows lower voltage.

The second, post-cut A-module shows similar or higher voltage than the second module when it is cut silver side up and silver side down whilst the second, post-cut B-module shows no voltage or only a low voltage.

The third, post-cut A-module shows higher voltage than the third module when it is cut silver side up whilst the third, post-cut B-module shows no voltage at all.

In all cases, therefore, the post-cut A-module functions without degradation or any measured sign of shorting whereas the post-cut B-module typically shows some sign of shorting.

Further evidence for fragmentation and/or delamination of the electrode layers can be gained from scanning electron microscopy and light microscopy.

Figure 11:
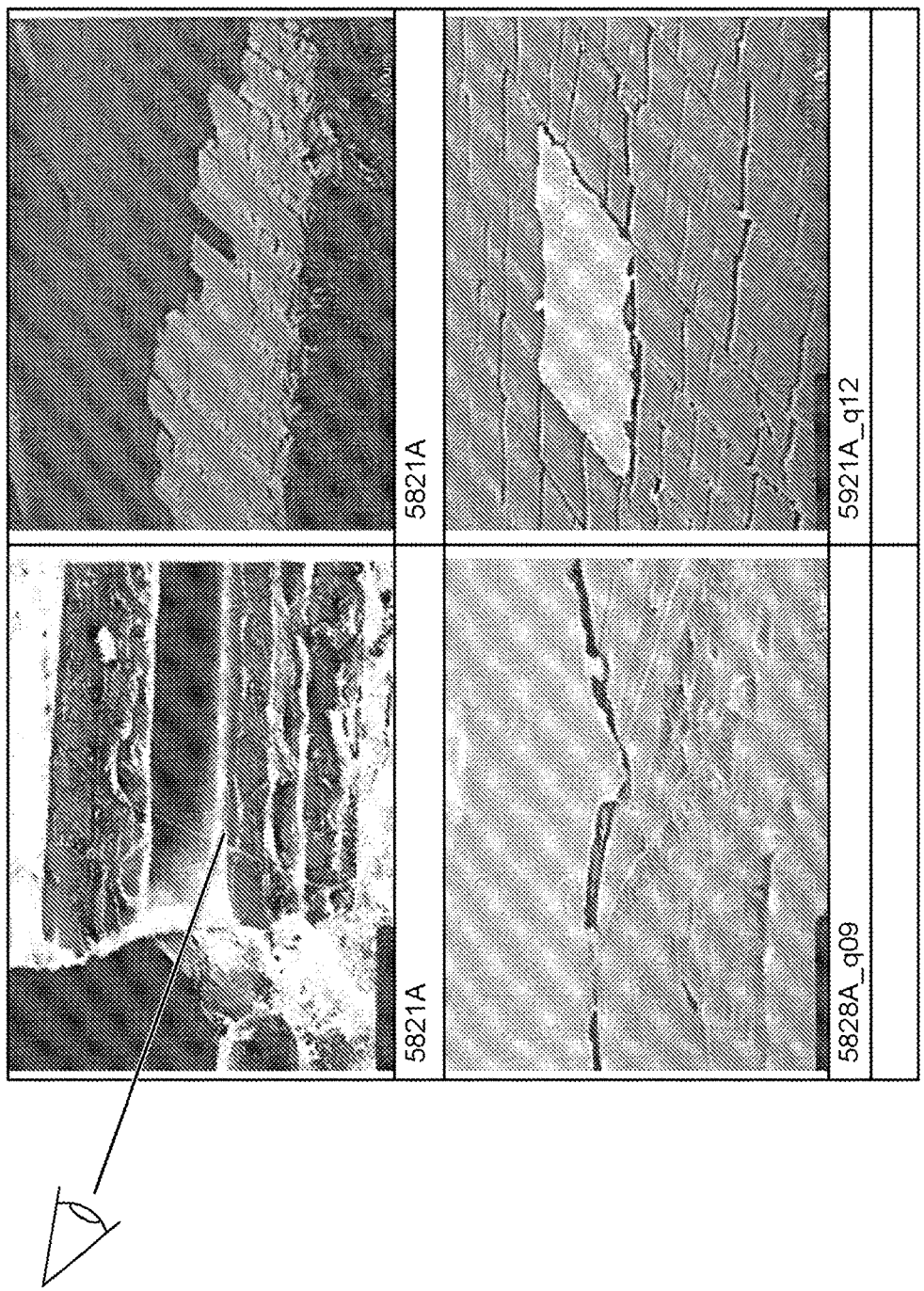
FIG. 11 shows photographs obtained by scanning electron microscopy (SEM) indicating fragmentation of an electrode in an edge portion of a solar module obtained by cutting the module of FIG. 2.

FIG. 11 shows a scanning electron microscopy image of the edge of the third, post-cut A-module as well as images of an electrode layer in an edge portion of the module (at different magnifications).

As may be seen, the bottom electrode layer has become delaminated from its overlying layers in the edge portion and fragmentation of the electrode layer in this portion has also occurred.

Figure 12:
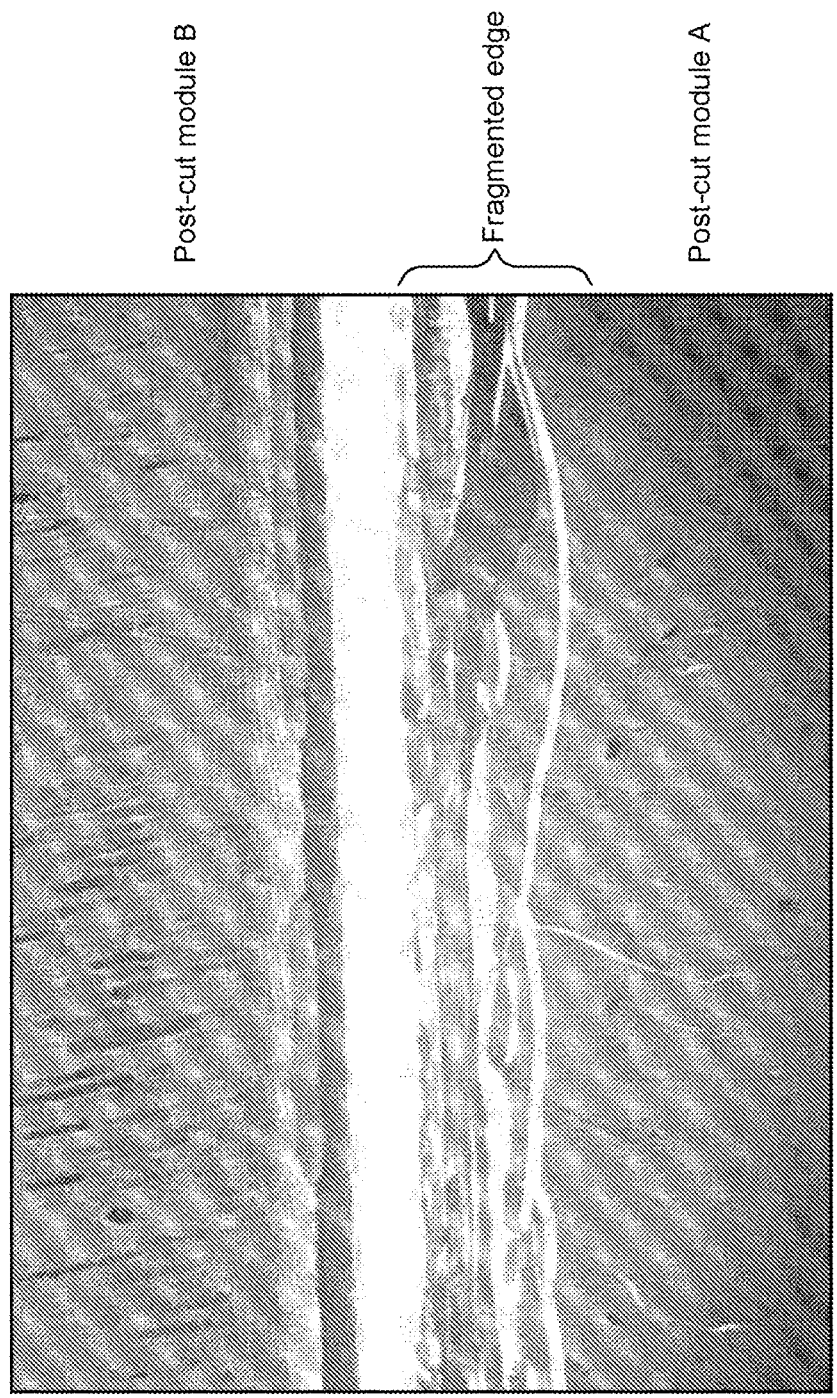
FIG. 12 is a microscope image of an edge portion of the solar module of FIG. 9.

FIG. 12 shows a microscope image of the edge portions of a post-cut A-module (lower part of image) and a post-cut B-module (upper part of image) obtained by cutting the third module.

As may be seen, there is significant fragmentation of the silver electrode layer in the edge portion of the post-cut A-module and hardly any fragmentation in the edge portion of the post-cut B-module.

The image is accompanied by a line drawing particularly highlighting that that the fragmentation extends along substantially the whole of the cut edge in the post-cut A-module.

Figure 13:
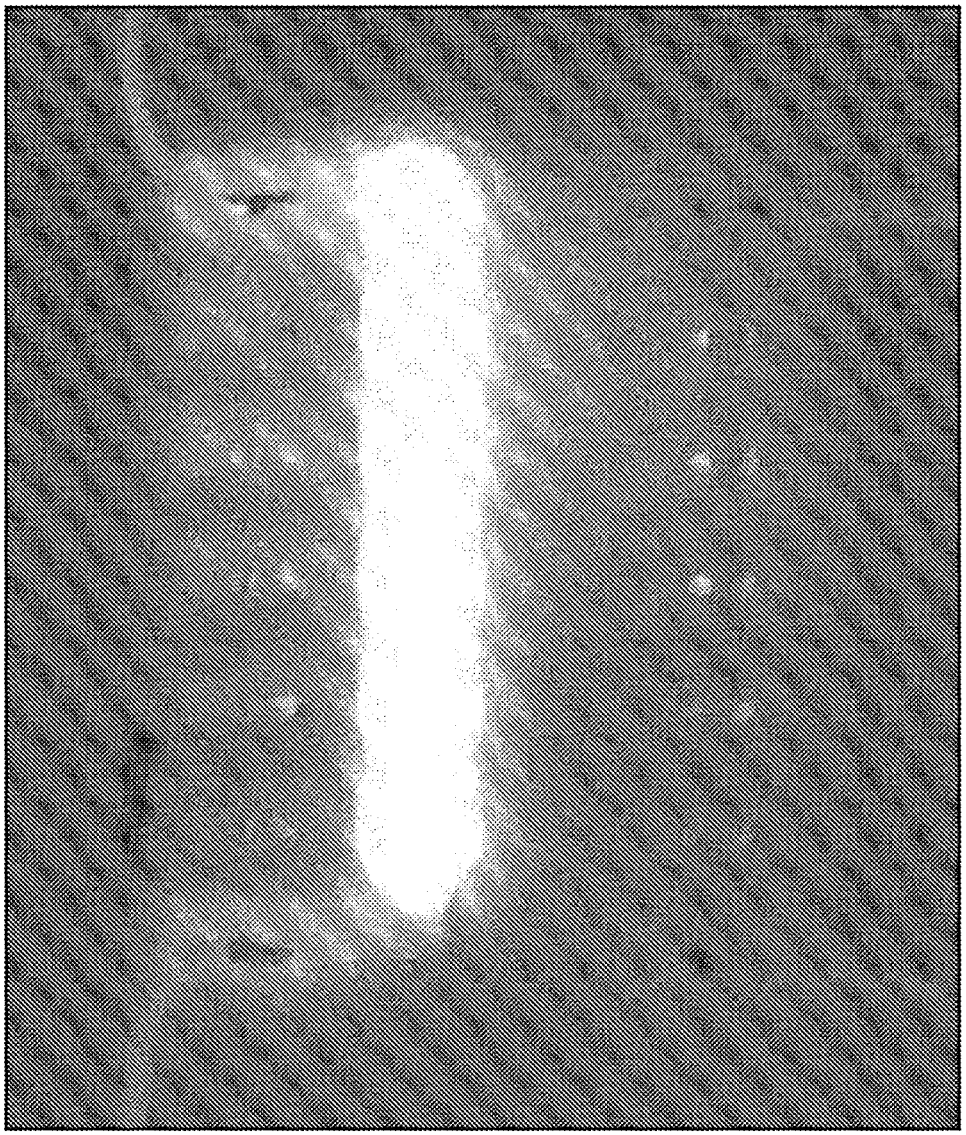
FIG. 13 is a thermographic image showing heat losses in solar modules formed by cutting the module of FIG. 2.

FIG. 13 shows a thermographic (IR) image of the post-cut A-module (lower part of image) and the post-cut B-module (higher part of image) obtained by cutting of the third module.

As may be seen, there is considerable heat dissipation from the post-cut B-module (brightly illuminated) but no heat dissipation from the post-cut A-module.

The absence of heat dissipation from the post-cut A-module strongly suggests an absence of electrical shunting and consequently the fragmentation of at least one of the electrode layers in that module.

Of course, the solar modules described here need not comprise connected stacks and the FIGS. 5 to 6 and 8 in particular can be considered to show modules in which a large area photovoltaic cell is provided instead of the plurality of connected stacks.

The present invention has been described in detail with reference to certain embodiments which are illustrated in the drawings. However, it will be understood that other embodiments not described in detail or illustrated in the drawings are within the scope of the present invention.

The invention claimed is:

1. A flexible, thin film electronic device comprising a module cut from a web provided with one or more cells along substantially the whole of its length wherein the cells comprise a first electrode layer, a second electrode layer and one or more active layers provided between the first and second electrode layers characterised in that the module includes one or more edge portions wherein an edge of the first electrode layer and an edge of the second electrode layer are each substantially coincident with an edge of the web, at least one of said one or more edge portions of one or both of the first and second electrode layers is a cut and fragmented edge portion comprising localized fragmentation extending along the whole of the cut and fragmented edge portion to prevent electrical shorting across a major portion of the device.

2. The device according to claim 1, in which at least one of the first and second electrode layers is delaminated from an adjacent other of the first and second electrode layers in said one or more edge portions whereby to prevent electrical shorting across a major portion of the device.

3. The device according to claim 1, in which said one or more edge portions extend inwardly to an extent between 1 μm and 2 cm.

4. The device according to claim 1, including a sealing means for sealing said edges of said one or more edge portions whereby to prevent the ingress of oxygen and/or water to the device.

5. The device according to claim 4, in which a deformable adhesive layer is provided between at least one of the first and second electrode layers and the cover sheet or between the web and the first and second electrode layers.

6. A method for manufacturing a flexible, thin film electronic device, which method comprises providing one or more cells along substantially the whole of a length of a web wherein the cells comprise a first electrode layer, a second electrode layer and one or more active layers provided between the first and second electrode layers characterised by cutting the web and both the first and second electrode layers to form a module which includes one or more edge portions wherein an edge of the first electrode layer and an edge of the second electrode layer are substantially coincident with an edge of the web, and cutting to cause localized fragmentation of one or both of the first and second electrode layers in said one or more edge portions, the localized fragmentation extending along the whole of a cut edge to prevent electrical shorting across a major portion of the device.

7. The method according to claim 6, in which the cutting provides a module in which at least one layer is delaminated from an adjacent layer in said one or more edge portions whereby to prevent electrical shorting across a major portion of the device.

8. The method according to claim 6, further comprising providing sealing means for sealing said edges of said one or more edge portions whereby to prevent the ingress of oxygen and/or water to the device.

9. The method according to claim 6 in which the cutting is carried out by a rotary blade cutter, by scissors or by a guillotine or by stamping or punching out or by knife cutting.

10. The method according to claim 6, in which the cutting comprises cutting in a first direction followed by cutting in a second direction which is opposite from the first direction.

11. The method according to claim 6, in which the cutting is preceded and/or followed by sharp bending, heating or sonication of the web in portions which correspond to said one or more edge portions after the cutting.

* * * * *